(12) United States Patent
Hargrove et al.

(10) Patent No.: US 6,320,225 B1
(45) Date of Patent: Nov. 20, 2001

(54) SOI CMOS BODY CONTACT THROUGH GATE, SELF-ALIGNED TO SOURCE- DRAIN DIFFUSIONS

(75) Inventors: Michael J. Hargrove, Clinton Corners; Jack A. Mandelman, Stormville, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/351,647

(22) Filed: Jul. 13, 1999

(51) Int. Cl.$^7$ .................................................. H01L 27/01
(52) U.S. Cl. ............................................ 257/347; 257/773
(58) Field of Search .................................... 257/347, 412, 257/773, 900, 413, 401

(56) References Cited

U.S. PATENT DOCUMENTS 6,175,135 * 1/2001 Liao ..................................... 257/347

* cited by examiner

Primary Examiner—Mark V. Prenty
(74) Attorney, Agent, or Firm—DeLio & Peterson, LLC; Kelly M. Reynolds

(57) ABSTRACT

A structure and process for making a semiconductor device with SOI body contacts under the gate conductor. The gate conductor is partitioned into segments and provides a body contact under each gate conductor segment over the width of the device. A plurality of body contacts may be distributed across the length of the gate conductor. This results in a relatively short path for holes leaving the body to traverse and allows accumulated charge to be removed from the body region under the gate. The structure provides for stable and efficient body-contact operation for SOI MOSFETS of any width operating at high speeds.

9 Claims, 6 Drawing Sheets

SOI CMOS BODY CONTACT THROUGH GATE, SELF-ALIGNED TO SOURCE- DRAIN DIFFUSIONS

BACKGROUND OF THE INVENTION

1. Field of the Invention

The present invention relates generally to a semiconductor device, and more particularly to a method for forming a silicon on insulator structured substrate with body-contacts under the gate conductor.

2. Description of Related Art

In the silicon on insulator ("SOI") art, it is well recognized that the resistance-capacitance ("RC") delay associated with body-contacts to wide channel MOSFETS limits the effectiveness of body-charge equilibrium at high-speeds. This occurs because the charge associated with the SOI body must traverse the half-width of the MOSFET. The resistance of the path increases with increasing width of the main channel until RC time constant of the body contact becomes a significant factor, which may cause unstable device behavior. The increased resistance degrades the ability of the device to remove hole charge (majority carriers in an NMOSFET) because in a wide channel device the holes leaving the body must traverse a long path. An analogous situation exists in SOI PMOSFETS, where excess electrons in the body comprise the majority carrier charge to be removed. Excess holes remain in the body of the device causing the device to latch up and lose gate control. With the need for wide devices in the semiconductor art, it is difficult to achieve a stable device.

Bearing in mind the problems and deficiencies of the prior art, it is therefore an object of the present invention to provide a method and structure for efficient body-contact operation for SOI MOSFETS of any width operating at high-speeds.

It is another object of the present invention to provide a method and structure for SOI body-contacts that are easily integrated into existing SOI processes.

It is another object of the present invention to enhance the ability of a wide body SOI MOSFET to remove excess majority carrier charge.

A further object of the invention is to provide a method and structure for an SOI body-contact that requires only one additional masking level.

It is yet another object of the present invention to provide a method and structure for an SOI body-contact that consumes no additional real estate on a substrate.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to a method of forming a silicon on insulator body contact under a gate conductor on a silicon on insulator substrate. In the preferred embodiment, the method comprises depositing a first insulating layer, such as tetraethoxysilane, over the silicon on insulator substrate. An opening is formed in the first insulating layer and extends through the first insulating layer, through the gate conductor to the semiconductor substrate. The opening has an insulating spacer on each of its sidewalls which are adjacent the first insulating layer and gate conductor regions. In the preferred embodiment, the insulating spacers are silicon nitride. A layer of a first conductive material, preferably P+ polysilicon, is deposited in the opening. In the preferred embodiment, the first conductive material layer is recessed so that the top of the first conductive material layer maintains electrical contact with a monocrystalline semiconductor layer of the silicon on insulator substrate. It is also preferred to deposit a second insulating material, preferably tetraethoxysilane, over the first conductive material layer.

In the preferred embodiment the method also comprises depositing a layer of a second conductive material, such as polysilicon, over the second insulating layer and depositing a layer of a metal such as tungsten, titanium or cobalt over the second conductive material layer. In the preferred embodiment, the metal layer is reacted with the second conductive material layer to form a silicide that is self aligned to the gate conductor.

In another aspect of the preferred embodiment, the method includes implanting a dopant, such as boron, into the semiconductor substrate at the bottom of the body-contact via.

In another aspect, the invention comprises a body contact structure under a gate conductor on a silicon on insulator substrate. The preferred embodiment comprises a first insulating layer, such as tetraethoxysilane, lying over, and in electrical contact with, the gate conductor. In the preferred embodiment, there is an opening in the substrate which extends from a top surface of the first insulating layer, through the gate conductor to the semiconductor substrate. On each sidewall of the opening, in the area adjacent the first insulating layer and the gate conductor, an insulating spacer is formed. The insulating spacer is preferably a silicon nitride. In the preferred embodiment, the opening is filled with a layer of a second insulating material, preferably tetraethoxysilane, on top of the first conductive material layer, which is preferably P+ polysilicon.

In the preferred embodiment, a second conductive material layer, such as polysilicon, is over the second insulating layer. In the preferred embodiment, a salicide is found over the gate conductor.

It is also preferred to have a dopant, such as boron, implanted at the bottom of the opening.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description that follows taken in conjunction with the accompanying drawings in which:

DESCRIPTION OF THE PREFERRED EMBODIMENTS(s)

Figure 1:
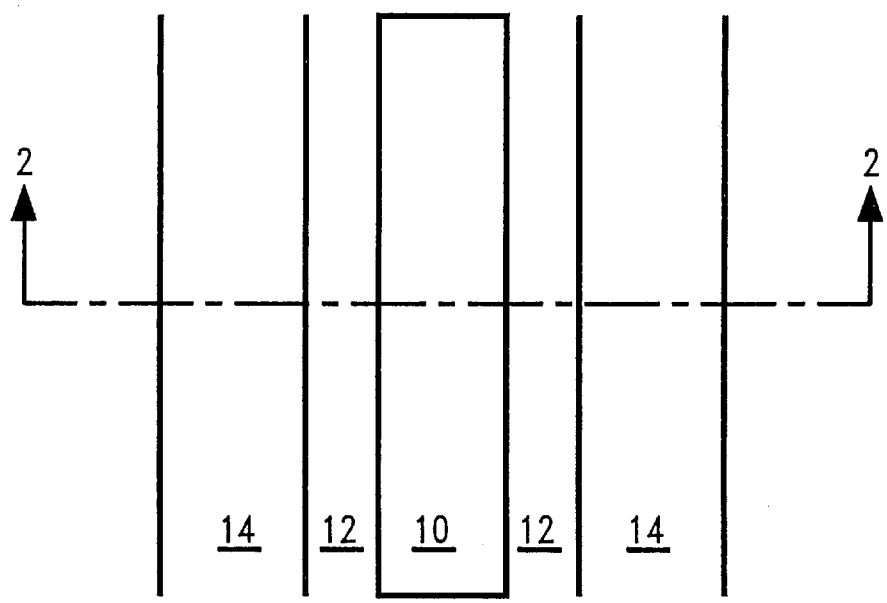
FIG. 1 is a top plan view of the SOI structure of the present invention showing the gate conductor region and nitride spacers.

In describing the preferred embodiment of the present invention, reference will be made herein to FIGS. 1–13 of the drawings in which like numerals refer to like features of the invention. Features of the invention are not necessarily shown to scale in the drawings. As used herein, unless otherwise noted, the terms "insulating" or "insulator" means "electrically insulating" and the term "contact" mean "electrical contact." The terms "on top of" or "over" are also used to denote "electrical contact."

The present invention creates a semiconductor device with SOI body-contacts under the gate conductor. The body-contacts are self aligned and borderless to adjacent source/drain diffusions, thus preventing diffusion-to-body shorts. In the typical MOSFET device, the body charge must traverse along the width direction of the transistor with a relatively long path. The present invention partitions the gate conductor into segments and provides body-contacts under each gate conductor segment over the whole width of the device. This results in a relatively short path between adjacent MOSFET channel regions and allows accumulated charge to be removed from the body region under the gate. The present invention may be used selectively on semiconductor structures that are wide and require special stability considerations, such as a PASS gate transistor. While stability may be less of a concern with grounded source transistors, the present invention may also be used with grounded source transistors.

Figure 2:
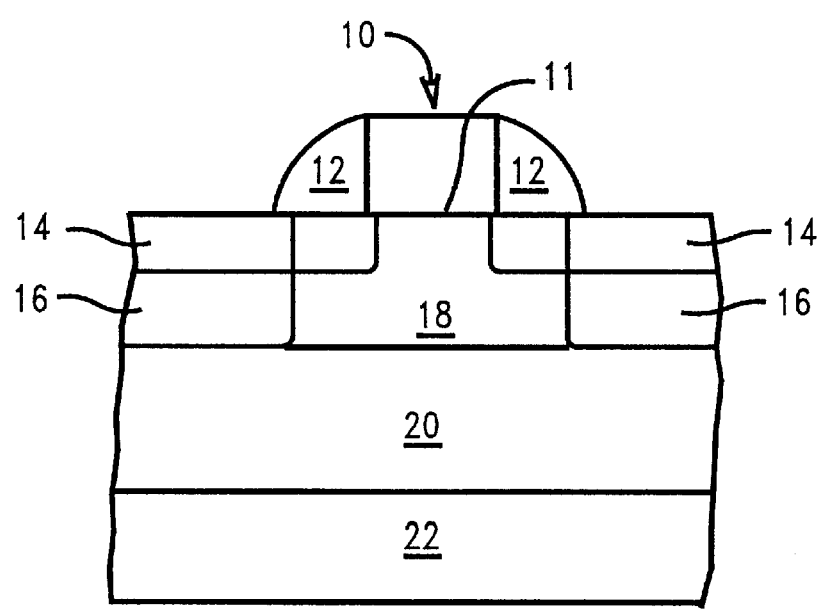
FIG. 2 is cross-sectional view of FIG. 1 taken along the line 2—2 of FIG. 1.

Using conventional processes, a gate conductor 10 with nitride spacer 12 is deposited over, and is in electrical contact with, an SOI semiconductor structure 52 as shown in FIGS. 1 and 2. SOI semiconductor structure 52 generally comprises a monocrystalline silicon layer 18 on top of, and in electrical contact with, a back oxide layer 20 that is on top of a thick monocrystalline silicon semiconductor substrate 22. Monocrystalline silicon layer 18 may be a P-SOI layer. Back oxide layer 20 may be a buried oxide ("BOX") layer and monocrystalline silicon semiconductor substrate 22 may be a P-substrate layer. Normal CMOS processing may be followed for forming the n and p doping in the body of the transistors, growing gate dielectric 11, and depositing gate conductor 10. Gate conductor 10 may comprise either doped polysilicon or undoped polysilicon that is later doped. Gate conductor 10 may also comprise a multi-layered structure such as polysilicon with a silicide on top. The height of gate conductor 10 may be in the range of 1000 to 2500 angstroms.

After depositing gate conductor 10, gate conductor 10 may be patterned with a gate conductor mask to form regions that will be the gate conductors of the MOSFETS. Next, a pair of source/drain extensions 14 is implanted. These implants may be N-extensions for an N-MOSFET (P-extensions for a P-MOSFET), and can be relatively lightly doped for a source/drain.

A nitride spacer 12 is formed on either side of gate conductor 10. Nitride spacer 12 is used to prevent body-contact 50 from shorting to the diffusion region. The width of nitride spacer 12 may be about the width of gate conductor 10. The width of gate conductor 10 is preferably in the range of 0.1 to 0.25 microns, and the width of nitride spacer 12 is on the order of 0.5 to 1 times the width of gate conductor 10. After nitride spacer 12 is formed, more heavily doped N-source and drain regions 16 are formed to create an N-MOSFET. While an NFET process is described, a similar process may be used to form a PFET.

Figure 3:
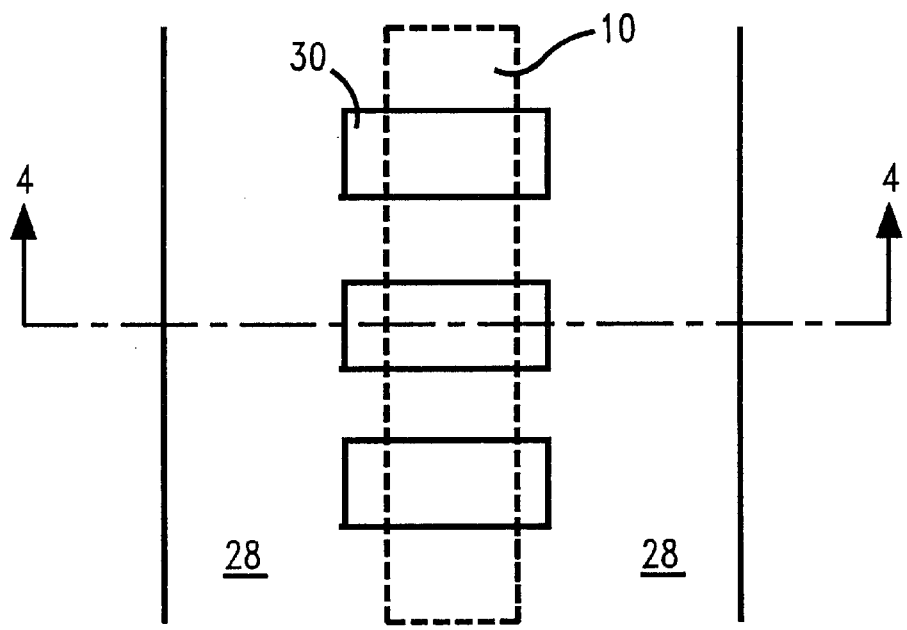
FIG. 3 is a top plan view of the SOI structure of the present invention showing the body-contact mask opening.
Figure 4:
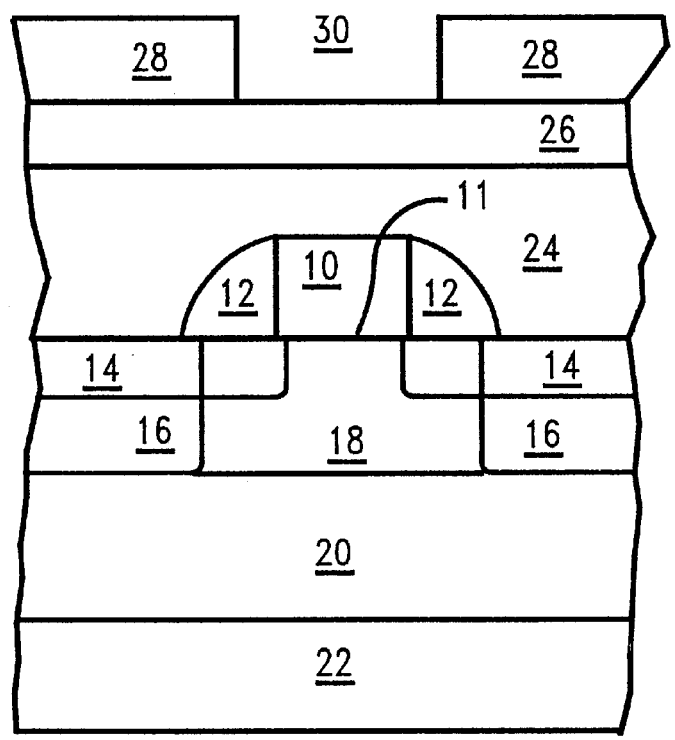
FIG. 4 is a cross-sectional view of FIG. 3 taken along the line 4—4 of FIG. 3.

As shown in FIG. 4, a first layer of tetraethoxysilane 24 ("TEOS") is deposited over the top of nitride spacer 12, gate conductor 10 and substrate 22. TEOS layer 24 may be deposited to a thickness in the range of 1500 to 3000 angstroms. TEOS layer 24 may then be planarized using a process such as chemical mechanical polishing. A layer of silicon nitride may then be deposited over TEOS layer 24 to form nitride hard mask layer 26. The thickness of nitride hard mask layer 26 may be in the range of 1000 to 2000 angstroms. Nitride hard mask layer 26 serves as a hardmask that resists etching for the subsequent etching of body-contact opening 30. Photoresist layer 28 is deposited on top of nitride hardmask layer 26, and a masking layer 29 is then used to form body-contact opening 30 in photoresist layer 28 over gate conductor 10. Body-contact opening 30 will subsequently contain the body-contact. Body-contact opening 30 is preferably borderless to the edge of gate conductor 10 as shown in FIG. 3. The rectangular regions in FIG. 3 show the formation of a plurality of body-contact openings 30 in photoresist layer 28. It should be noted that while the process described herein is for the formation of a single body-contact, a typical semiconductor manufacturing process entails the formation of a plurality of body contacts on an SOI structure.

Figure 5:
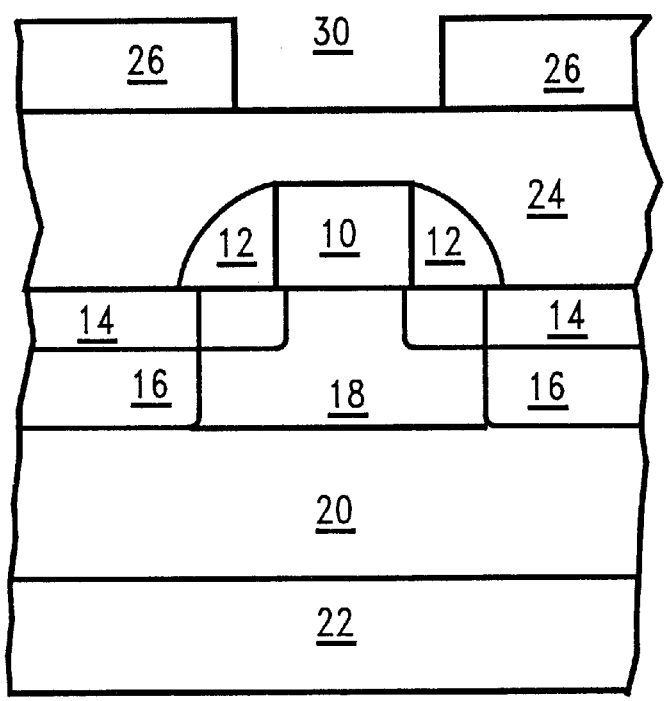
FIG. 5 is an elevational view of the SOI structure of the present invention showing the nitride layer opened to the TEOS layer.
Figure 6:
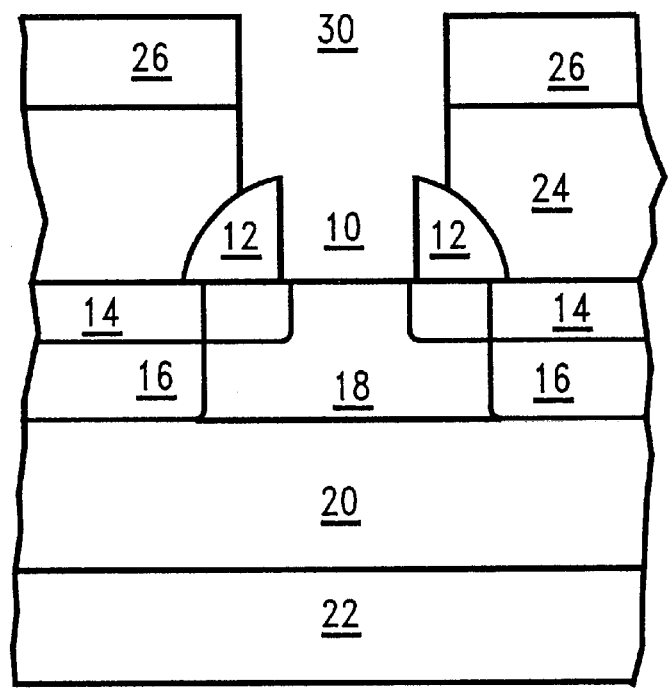
FIG. 6 is an elevational view of the SOI structure of the present invention after opening the gate conductor to the polysilicon surface.

Nitride hard mask layer 26 is then opened to TEOS layer 24 and photoresist layer 28 is removed as shown in FIG. 5. After TEOS layer 24 is exposed, a silicon oxide reactive ion etch which is selective to nitride may be performed using nitride hardmask layer 26 as a mask. TEOS layer 24 is opened to expose the top surface of gate conductor 10 and each nitride spacer 12. Once gate conductor 10 is exposed, gate conductor 10 may also be reactive ion etched selective to nitride and oxide, stopping at the surface of the oxide of gate dielectric 11 remaining under gate conductor 10 at the surface as shown in FIG. 6.

Figure 7:
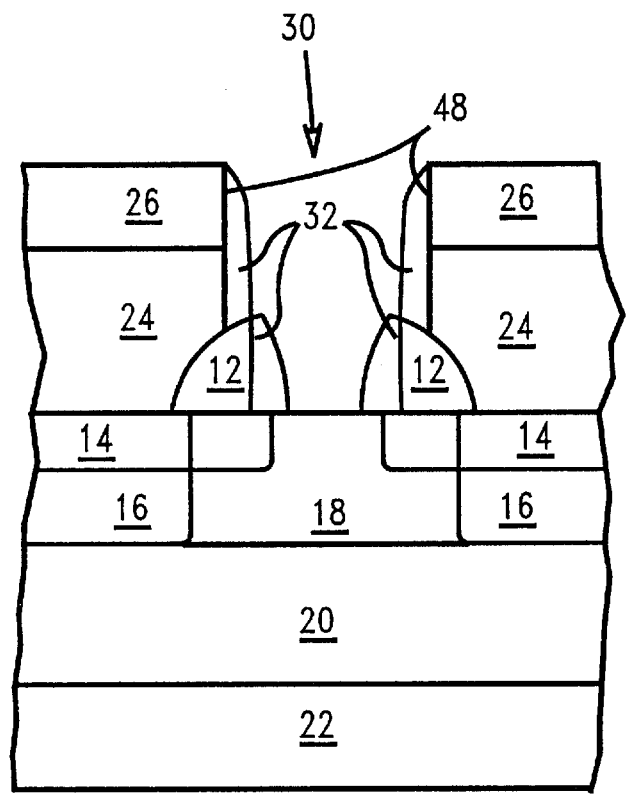
FIG. 7 is an elevational view of the SOI structure of the present invention showing the formation of nitride spacers on the sidewalls of the body-contact opening.

A second nitride spacer 32 is then preferably formed on the each sidewall 48 of opening 30 as shown in FIG. 7. Spacer 32 preferably has a thickness in the range of 100 to 300 angstroms, and may be formed by depositing a thin layer of silicon nitride by chemical vapor deposition and doing a reactive ion etch to remove nitride from the horizontal surfaces leaving spacer 32 on each sidewall 48. The purpose of second nitride spacer 32 is to space the body-contact from the edge of source and drain diffusions 14 and 16.

Once spacer 32 is formed, any remaining gate oxide on top of P-SOI layer 18 is removed, preferably using a short isotropic etch containing fluorine which may be a buffered HF or hydrofluoric acid vapor.

Figure 8:
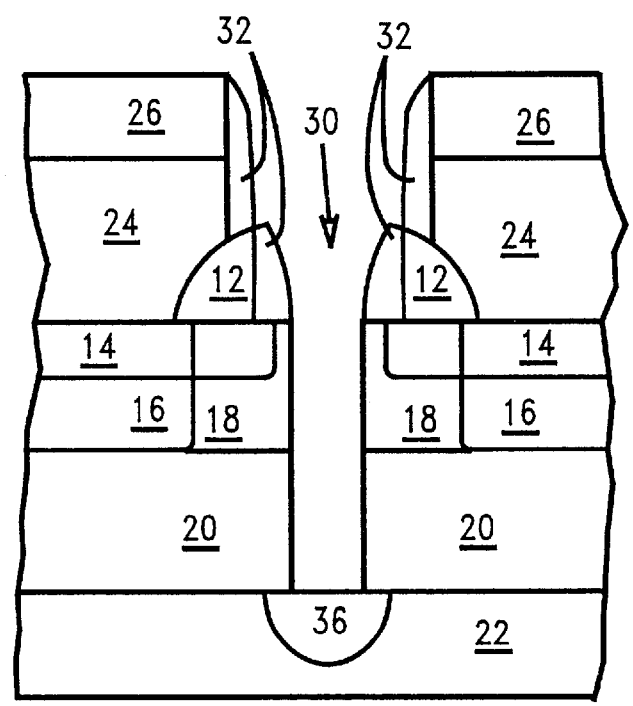
FIG. 8 is an elevational view of the SOI structure of the present invention after opening of the body-contact via to the semiconductor substrate.

As shown in FIG. 8, body-contact opening 30 is extended to P-substrate 22. A reactive ion silicon etch selective to nitride and oxide may be used to etch through P-SOI layer 18. Then a reactive ion oxide etch selective to nitride may be performed to etch through BOX layer 20 to P-substrate 22. Over etch control here is not critical and it is permissible to over etch slightly into P-substrate 22. A p type dopant species 36 may be implanted into P-substrate 22 at the bottom of body-contact opening 30 to reduce the resistance of the body-contact. Implant 36 is preferably boron. It is preferable that the doping concentration of implant 36 be in the range of $10^{14}$ to $10^{16}$ atoms per square centimeter.

Figure 9:
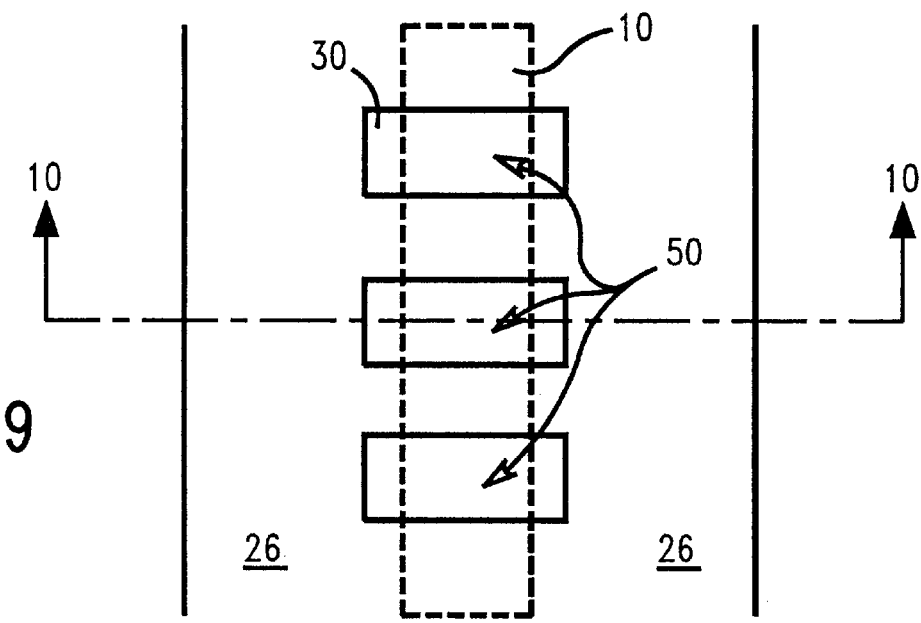
FIG. 9 is a top plan view of the SOI structure of the present invention showing the body contact of the present invention.
Figure 10:
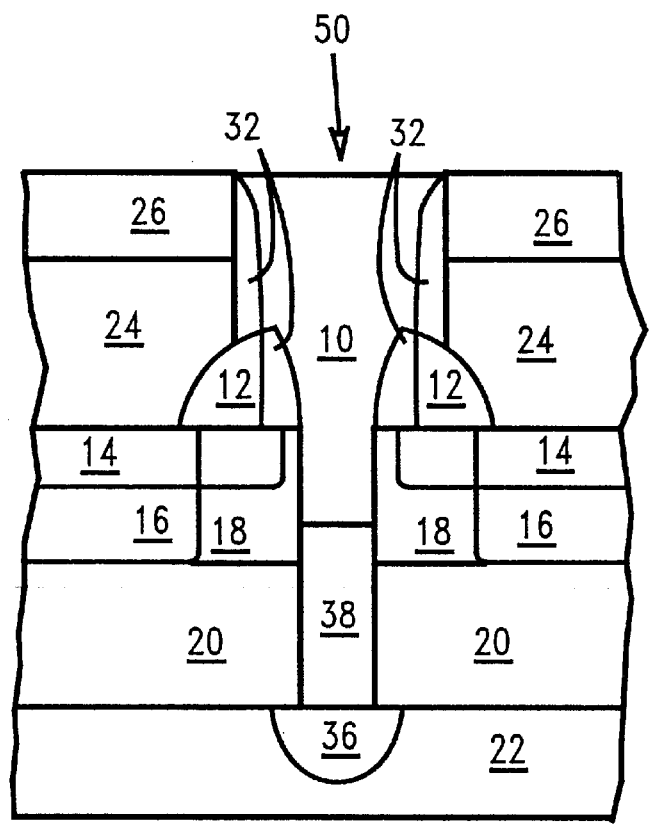
FIG. 10 is a cross-sectional view of FIG. 9 taken along the line 10—10 of FIG. 9.

Body-contact opening 30 is then filled with a conductive material, preferably a layer of P+ polysilicon 38. In the preferred embodiment, the P+ polysilicon layer 38 completely fills opening 30 and extends out on top of nitride layer 26. P+ polysilicon layer 38 may then go through a planarization process to remove any P+ polysilicon from the top of nitride layer 26, leaving P+ polysilicon layer 38 flush with nitride layer 26. P+ polysilicon layer 38 is then recessed to a depth so that the top of P+ polysilicon layer 38 is in contact with P-SOI layer 18. As shown in FIG. 10, the top of P+ polysilicon layer 38 is approximately ½ to ¾ of the way down the thickness of P-SOI layer 18. It is preferable that P+ polysilicon layer 38 be recessed far enough to keep P+ polysilicon layer 38 an adequate distance from diffusion region 16 and extension region 14 which might cause leakage problems, yet maintain contact with P-SOI layer 18. Next, a second insulating layer 40, preferably TEOS, is deposited over P+ polysilicon layer 38. TEOS layer 40 is preferably planarized to the top of nitride layer 26 to form body-contact 50. As shown in FIG. 9, a plurality of body-contacts 50 are distributed across the length of gate conductor 10.

Figure 11:
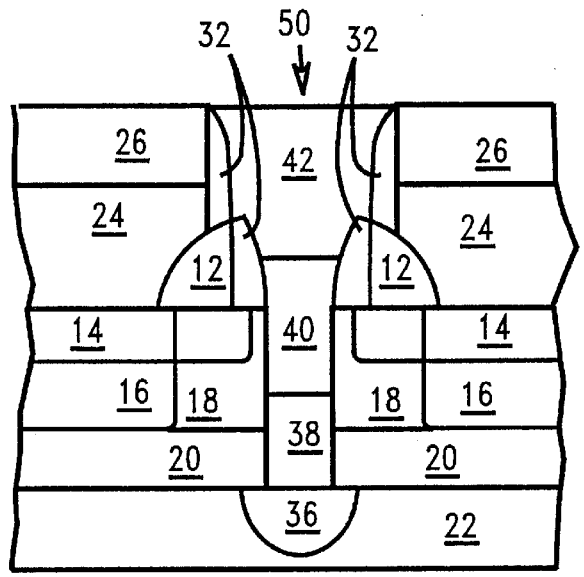
FIG. 11 is an elevational view of the SOI structure of the present invention after deposition of a low-resistance region in the body-contact opening.

Since at this point the gate conductor regions are separated and not connected, a bridge must be formed across the gate conductor regions to control the voltage on every segment of gate conductor 10. As shown in FIG. 11, TEOS layer 40 is recessed, selective to nitride, to below the top surface of gate conductor 10, but shallow enough to assure that a region of TEOS remains to provide insulation to body contact 50. A conductive layer 42, preferably polysilicon, is deposited over the remaining TEOS layer 40. Polysilicon layer 42 may be doped or undoped. Polysilicon layer 42 is then polished to the top of nitride layer 26 and implanted to provide a low resistance region having a workfunction which matches the workfunction of the polysilicon of gate conductor 10. Now, regions of polysilicon layer 42 are surrounded by nitride in the contact holes that are adjacent to the gate conductor regions.

Figure 12:
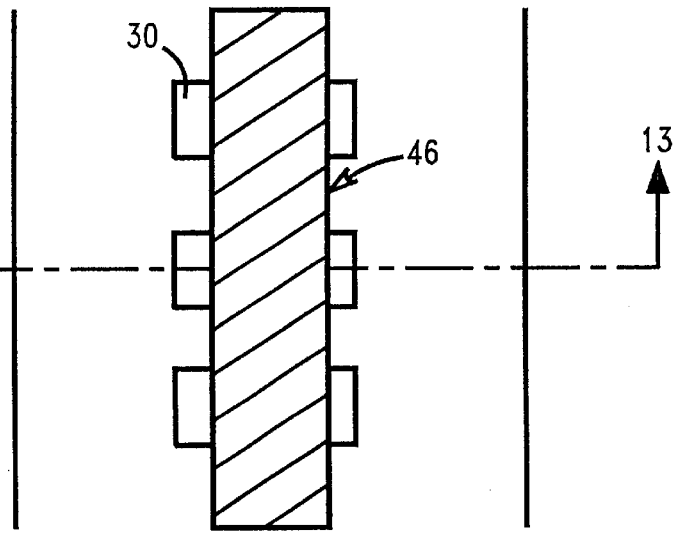
FIG. 12 is a top plan view of the SOI structure of the present invention showing a low resistance salicide over the gate conductor.
Figure 13:
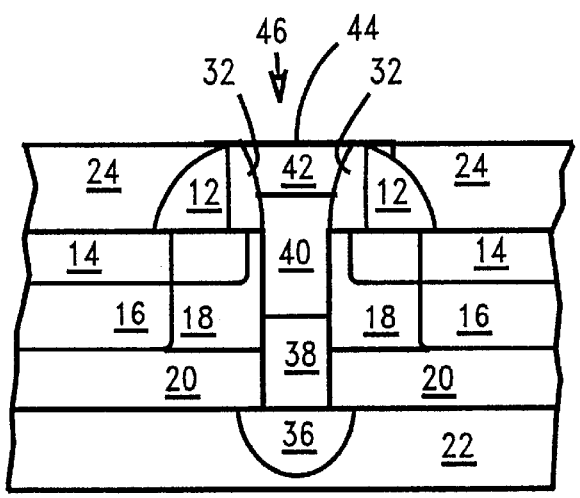
FIG. 13 is a cross-sectional view of FIG. 12 taken along the line 13—13 of FIG. 12.

To electrically connect these regions, a reactive ion etch is preferably used to remove nitride hardmask layer 26, a top portion of polysilicon layer 42 and a portion of nitride spacer 32. The remaining surface may then be polished, typically by chemical mechanical polishing, to planarize the top of polysilicon layer 42, TEOS layer 24 with the tops of spacers 12 and 32. Then, as shown in FIG. 12, a thin metal layer 44, such as tungsten, titanium or cobalt, may be deposited over the tops of layers 42, 24 and spacers 12 and 32, and reacted with polysilicon layer 42 to form a silicide layer 46 which is self-aligned ("SALICIDE") to the exposed gate conductor 10 polysilicon and the top surface of polysilicon layer 42. The formation of silicide by the reaction of metal and silicon (polysilicon) is typically achieved at elevated temperatures in an inert ambient. The metal overlying the oxide areas is unreacted and may be etched off selectively to the salicide. This leaves the low-resistance salicide 46 over gate conductor 10 to provide gate continuity as shown in FIG. 12.

It should be noted that while the above process describes the formation of a single body contact, in the typical structure, a plurality of body contacts may be formed.

By partitioning the gate conductor into segments and providing a body contact under each gate conductor segment over the whole width of the device, the charge associated with the SOI body travels a relatively short path. This allows excess majority carrier charge to be removed from the body region under the gate and provides for efficient body contact operation for SOI MOSFETS of any width operating at high speeds. The method and structure of the present invention is easily integrated into existing SOI processes requiring only one additional masking level, and does not consume additional real estate on a semiconductor substrate.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A body contact structure under a gate conductor on a silicon on insulator substrate comprising:

(a) a first insulating layer overlying said gate conductor and said silicon on insulator substrate;

(b) an opening in said substrate extending from a top surface of said first insulating layer through said gate conductor to a semiconductor substrate, said opening having a pair of sidewalls and a bottom;

(c) an insulating spacer, one on each of said sidewalls of said opening adjacent said first insulating layer and said gate conductor;

(d) a layer of a first conductive material in said opening;

(e) a layer of a second insulating material over said first conductive material layer.

2. The structure of claim 1 further comprising:

(f) a layer of a second conductive material over said second insulating layer.

3. The structure of claim 2 further comprising a salicide over said gate conductor.

4. The structure of claim 1 wherein a dopant is implanted into said semiconductor substrate at the bottom of said opening.

5. The structure of claim 4 wherein said dopant is boron.

6. The structure of claim 1 wherein said first and second insulating layers are tetraethoxysilane.

7. The structure of claim 1 wherein said insulating spacer is silicon nitride.

8. The structure of claim 1 wherein said first conductive material is P+ polysilicon.

9. The structure of claim 2 wherein said second conductive material is polysilicon.

* * * * *